United States Patent
Yu et al.

(10) Patent No.: US 9,236,277 B2
(45) Date of Patent: Jan. 12, 2016

(54) INTEGRATED CIRCUIT WITH A THERMALLY CONDUCTIVE UNDERFILL AND METHODS OF FORMING SAME

(71) Applicant: Taiwan Semiconductor Manufacturing Company, Ltd., Hsin-Chu (TW)

(72) Inventors: Chen-Hua Yu, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 8 days.

(21) Appl. No.: 13/628,564

(22) Filed: Sep. 27, 2012

(65) Prior Publication Data

US 2014/0042614 A1 Feb. 13, 2014

Related U.S. Application Data

(60) Provisional application No. 61/681,941, filed on Aug. 10, 2012.

(51) Int. Cl.
| | |
|---|---|
| H01L 23/48 | (2006.01) |
| H01L 23/52 | (2006.01) |
| H01L 29/40 | (2006.01) |
| H01L 21/44 | (2006.01) |
| H01L 21/4763 | (2006.01) |

(Continued)

(52) U.S. Cl.
CPC .............. *H01L 21/563* (2013.01); *H01L 24/16* (2013.01); *H01L 24/29* (2013.01); *H01L 24/73* (2013.01); *H01L 24/81* (2013.01); *H01L 24/92* (2013.01); *H01L 25/0657* (2013.01); *H01L 24/13* (2013.01); *H01L 24/17* (2013.01); *H01L 24/32* (2013.01); *H01L 24/33* (2013.01); *H01L 24/83* (2013.01); *H01L 2224/131* (2013.01); *H01L 2224/1601* (2013.01); *H01L 2224/16145* (2013.01); *H01L 2224/16227* (2013.01); *H01L 2224/17181* (2013.01); *H01L 2224/2919* (2013.01); *H01L 2224/32145* (2013.01); *H01L 2224/32225* (2013.01); *H01L 2224/33181* (2013.01); *H01L 2224/73204* (2013.01); *H01L 2224/8192* (2013.01); *H01L 2224/831* (2013.01); *H01L 2224/83104* (2013.01); *H01L 2224/83855* (2013.01); *H01L 2224/92* (2013.01);

(Continued)

(58) Field of Classification Search
CPC ................. H01L 2224/16; H01L 2924/01079; H01L 2924/01029; H01L 2924/14; H01L 23/10; H01L 23/4006; H01L 2924/01013; H01L 21/76843; H01L 21/563; H01L 25/0657; H01L 24/16; H01L 24/29; H01L 24/73; H01L 24/81; H01L 24/92
USPC .......... 257/778, 782, 783, 786, 773, 733, 738; 438/108, 118, 612, 666, 618
See application file for complete search history.

(56) References Cited

U.S. PATENT DOCUMENTS

| | | | | |
|---|---|---|---|---|
| 2008/0039560 | A1* | 2/2008 | Mills et al. | 524/183 |
| 2008/0119014 | A1* | 5/2008 | Hooi | 438/118 |

(Continued)

*Primary Examiner* — A. Sefer
*Assistant Examiner* — Dilinh Nguyen
(74) *Attorney, Agent, or Firm* — Slater & Matsil, L.L.P.

(57) ABSTRACT

An integrated circuit includes a substrate and at least one chip. Each chip is disposed over the substrate or the other chip. Solder bumps are disposed between the substrate and the at least one chip. An insulating film is disposed around the solder bumps and provides electrical insulation for the solder bumps except areas for interconnections. A thermally conductive underfill is disposed between the substrate, the at least one chip, and the solder bumps.

21 Claims, 1 Drawing Sheet

(51) Int. Cl.
*H01L 21/56* (2006.01)
*H01L 25/065* (2006.01)
*H01L 23/00* (2006.01)

(52) U.S. Cl.
CPC ............ *H01L2225/06513* (2013.01); *H01L 2225/06517* (2013.01); *H01L 2225/06589* (2013.01)

(56) References Cited

U.S. PATENT DOCUMENTS

| | | | |
|---|---|---|---|
| 2009/0273073 A1* | 11/2009 | Tachibana et al. | 257/692 |
| 2010/0264552 A1* | 10/2010 | Nakasato et al. | 257/778 |
| 2012/0187583 A1* | 7/2012 | Karpur et al. | 257/787 |
| 2012/0280404 A1* | 11/2012 | Kwon et al. | 257/777 |

\* cited by examiner

INTEGRATED CIRCUIT WITH A THERMALLY CONDUCTIVE UNDERFILL AND METHODS OF FORMING SAME

RELATED APPLICATIONS

This disclosure claims priority to U.S. Provisional Patent Application Ser. No. 61/681,941, filed Aug. 10, 2012, which application is incorporated herein by reference.

TECHNICAL FIELD

The present disclosure relates generally to an integrated circuit and more particularly to a bump underfill.

BACKGROUND

For flip-chip bonding or 3D chip stacking, underfill material is used to fill up the gap between chips and/or a chip and a substrate/printed circuit board (PCB). However, some flip-chips or 3D chips suffer degradation or damage from high temperature due to accumulated heat arising from poor thermal conductivity through the underfill material that hinders cooling of the chips.

BRIEF DESCRIPTION OF THE DRAWINGS

Reference is now made to the following descriptions taken in conjunction with the accompanying drawings, in which.

DETAILED DESCRIPTION

Figure 1:
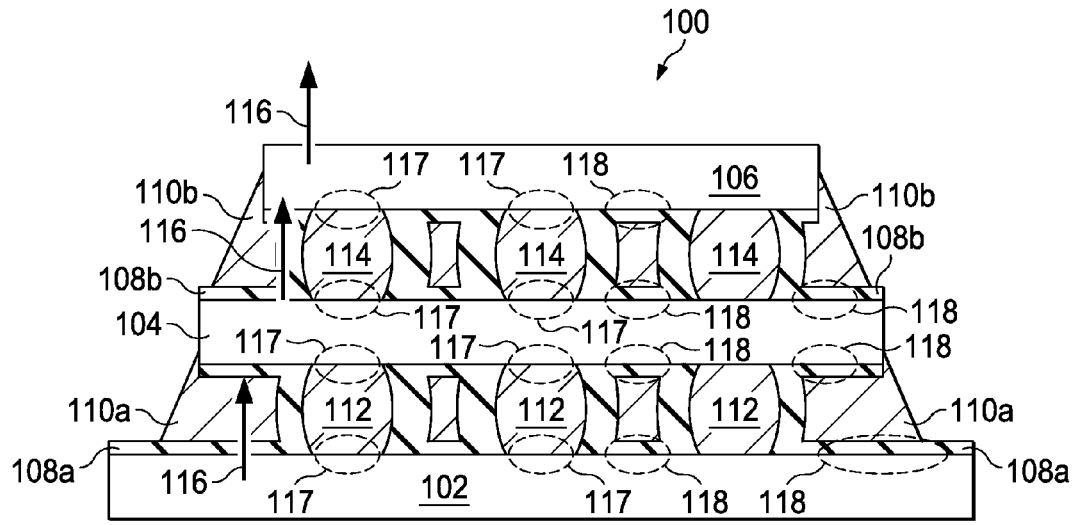
FIG. 1 is a schematic diagram of an exemplary integrated circuit underfill structure according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary integrated circuit underfill structure according to some embodiments. An integrated circuit 100 includes a substrate 102 and (integrated circuit) chips 104 and 106. The substrate 102 can be a silicon substrate (or any other suitable material), another integrated circuit chip, or a printed circuit board (PCB). The substrate 102 and/or chips 104 and 106 may include electrical devices or components fabricated on the surface, e.g., transistors, resistors, capacitors, etc. in some embodiments. The chip 104 can be an interposer in some embodiments.

The chip 104 is disposed over the substrate 102 and the chip 106 is disposed over the chip 104. Even though two chips 104 and 106 are shown over the substrate 102, there can be one chip, three or more chips over the substrate 102 stacked vertically. The substrate 102 and the chips 104 and 106 can be flip-chip bonded, 2.5D die-stacked, 3D die-stacked, or combined by any other methods. Solder bumps 112 and 114 are disposed between the substrate 102 and the chips 104 and 106, and provide interconnections. The solder bumps 112 and 114 can be micro solder bumps or ball grid array (BGA) solder bumps, for example, and have diameter/heights ranging from 10 µm to 800 µm in some embodiments.

Insulating films 108a and 108b are disposed around the solder bumps 112 and 114 respectively. The insulating films 108a and 108b provide electrical insulation for the solder bumps 112 and 114 except areas for interconnections such as 117. In some embodiments, the insulating films 108a and 108b cover some chip areas such as 118 between the solder bumps 112 or 114. In some embodiments, the substrate 102 and chips 104 and 106 may also have passivation or dielectric layers on the surfaces (not shown) for electrical insulation, such as silicon nitride or silicon dioxide.

The insulating films 108a and 108b are conformal to the solder bumps 112 and 114 (i.e. they maintain the general shape of the underlying topography, by having a uniform thickness), and have a thickness ranging from 500 angstrom to 20 µm in some embodiments. The insulating films 108a and 108b are formed (or coated) by atomic layer deposition or chemical vapor deposition, for example. The insulating films 108a and 108b comprise silicon dioxide, hafnium oxide, titanium oxide, zirconium oxide, polymer, aluminum oxide, other metal oxide, any combination thereof, or any other suitable material.

Thermally conductive underfill 110a and 110b, disposed between the substrate 102, the chips 104 and 106, and the solder bumps 112 and 114, provide protection and mechanical strength for the integrated circuit 100. Also, the underfill 110a and 110b compensate for any thermal expansion difference between the substrate 102 and chips 104 and 106. The underfill 110a and 110b are formed by dispensing and curing the underfill and the dispensing is performed by needle dispensing or jet dispensing in some embodiments.

The underfill 110a and 110b have a thermal conductivity of at least 0.5 W/mK in some embodiments for good heat conductivity. Heat dissipation is indicated by arrows 116, for example. In some embodiments, the underfill 110a and 110b comprise polymer such as commercially available Epo-TEK T7109 epoxy, which has a thermal conductivity of about 1.5 W/mK and an electrical resistivity of about $10^{13}$ ohm-cm. This provides a better thermal conductivity compared to some other material such as commercially available LOCTITE epoxy, which has a thermal conductivity of about 0.2 W/mK and an electrical resistivity of about $10^{16}$ ohm-cm. As a result, the integrated circuit 100 has improved thermal conductivity between the substrate 102 and stacked chips 104 and 106.

Figure 2:
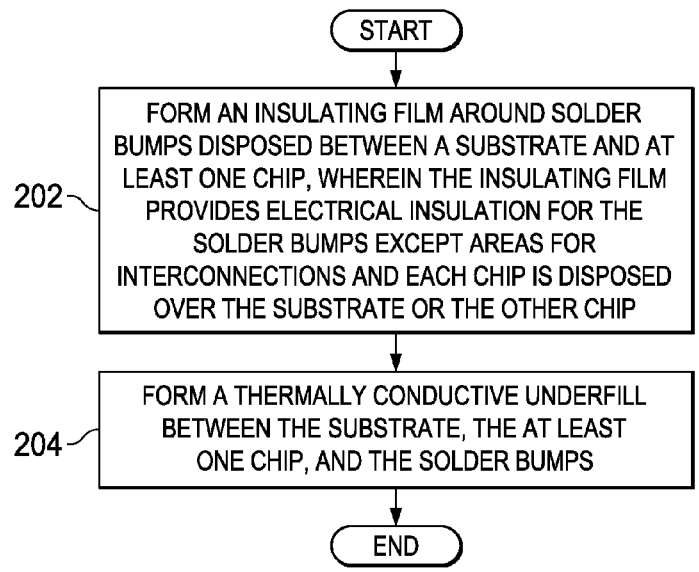
FIG. 2 is a flowchart of a method of fabricating the exemplary integrated circuit underfill structure in FIG. 1 according to some embodiments.

FIG. 2 is a flowchart of a method of fabricating the exemplary integrated circuit underfill structure in FIG. 1 according to some embodiments. At step 202, an insulating film is formed around solder bumps disposed between a substrate and at least one chip. The insulating film provides electrical insulation for the solder bumps except areas for interconnections. Each chip is disposed over the substrate or the other chip. The insulating film is formed (or coated) by atomic layer deposition or chemical vapor deposition, for example.

The insulating film is conformal to the solder bumps and has a thickness ranging from 500 angstrom to 20 μm in some embodiments. The insulating film comprises silicon dioxide, hafnium oxide, titanium oxide, zirconium oxide, polymer, aluminum oxide, other metal oxide, any combination thereof, or any other suitable material. The insulating film is formed to cover chip areas between the solder bumps in some embodiments.

At step 204, a thermally conductive underfill is formed between the substrate, the at least one chip, and the solder bumps. The thermally conductive underfill has a thermal conductivity of at least 0.5 W/mK in some embodiments for better heat conductivity. The thermally conductive underfill comprises polymer. In some embodiments, the underfill comprises commercially available Epo-TEK T7109 epoxy, which has a thermal conductivity of about 1.5 W/mK and an electrical resistivity of about $10^{13}$ ohm-cm. The underfill is formed by dispensing and curing the underfill, and the dispensing is performed by needle dispensing or jet dispensing in some embodiments.

According to some embodiments, an integrated circuit includes a substrate and at least one chip. Each chip is disposed over the substrate or the other chip. Solder bumps are disposed between the substrate and the at least one chip. An insulating film is disposed around the solder bumps and provides electrical insulation for the solder bumps except areas for interconnections. A thermally conductive underfill is disposed between the substrate, the at least one chip, and the solder bumps.

According to some embodiments, a method includes forming an insulating film around solder bumps disposed between a substrate and at least one chip. Each chip is disposed over the substrate or the other chip. The insulating film provides electrical insulation for the solder bumps except areas for interconnections. A thermally conductive underfill is formed between the substrate, the at least one chip, and the solder bumps.

According to some embodiments, an integrated circuit includes a substrate and at least one chip. Each chip is disposed over the substrate or the other chip. Solder bumps are disposed between the substrate and the at least one chip and provide interconnections. An insulating film is disposed around the solder bumps. The insulating film provides electrical insulation for the solder bumps except the interconnections provided by the solder bumps. A thermally conductive underfill is disposed between the substrate, the at least one chip, and the solder bumps. The thermally conductive underfill comprises polymer having a thermal conductivity of at least 0.5 W/mK.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. An integrated circuit, comprising:
   at least one chip disposed over a substrate;
   solder bumps electrically and physically contacting the substrate and the at least one chip;
   an insulating film disposed directly on the solder bumps, directly on a surface of the at least one chip, and directly on a surface of the substrate; and
   a thermally conductive underfill disposed between the substrate, the at least one chip, and the solder bumps.

2. The integrated circuit of claim 1, wherein the thermally conductive underfill has a thermal conductivity of at least 0.5 W/mK.

3. The integrated circuit of claim 1, wherein the thermally conductive underfill comprises polymer.

4. The integrated circuit of claim 1, wherein the insulating film comprises aluminum oxide, hafnium oxide, silicon dioxide, titanium oxide, zirconium oxide, polymer, or any combination thereof.

5. The integrated circuit of claim 1, wherein the insulating film is conformal to the solder bumps and has a thickness ranging from 500 angstrom to 20 μm.

6. The integrated circuit of claim 1, wherein the solder bumps have heights ranging from 10 μm to 800 μm.

7. The integrated circuit of claim 1, wherein the thermally conductive underfill surrounds the solder bumps and the insulating film on the solder bumps.

8. The integrated circuit of claim 1, wherein the substrate is another chip.

9. A method, comprising:
   coating an insulating film on solder bumps disposed between a substrate and at least one chip, wherein the insulating film has a substantially uniform thickness on sidewalls of the solder bumps as measured from the sidewalls of the solder bumps in a direction substantially perpendicular to the sidewalls of the solder bumps, the at least one chip being disposed over the substrate or another chip; and
   forming a thermally conductive underfill between the substrate, the at least one chip, and the solder bumps, wherein the thermally conductive underfill surrounds the solder bumps and the insulating film on the solder bumps.

10. The method of claim 9, wherein the thermally conductive underfill has a thermal conductivity of at least 0.5 W/mK.

11. The method of claim 9, wherein the thermally conductive underfill comprises polymer.

12. The method of claim 9, wherein the insulating film comprises aluminum oxide, hafnium oxide, silicon dioxide, titanium oxide, zirconium oxide, polymer, or any combination thereof.

13. The method of claim 9, wherein the insulating film is formed by atomic layer deposition or chemical vapor deposition.

14. The method of claim 9, wherein the insulating film is formed to cover areas of the at least one chip between the solder bumps.

15. The method of claim 9, wherein the insulating film is conformal to the solder bumps and has a thickness ranging from 500 angstrom to 20 μm.

16. The method of claim 9, wherein the thermally conductive underfill is formed by dispensing and curing underfill material.

17. The method of claim 16, wherein the dispensing is performed by needle dispensing or jet dispensing.

18. An integrated circuit, comprising:
a chip bonded to a substrate with solder bumps;
an insulating film disposed on the solder bumps; and
a thermally conductive underfill between the substrate, the chip, and the solder bumps, wherein the thermally conductive underfill surrounds the solder bumps and the insulating film on the solder bumps.

19. The integrated circuit of claim 18, wherein the insulating film comprises aluminum oxide, hafnium oxide, silicon dioxide, titanium oxide, zirconium oxide, polymer, or any combination thereof.

20. The integrated circuit of claim 18, wherein the insulating film covers chip areas between the solder bumps.

21. The integrated circuit of claim 18, wherein the insulating film is conformal to the solder bumps and has a substantially uniform thickness ranging from 500 angstrom to 20 μm.

* * * * *